(12) United States Patent
Haik et al.

(10) Patent No.: US 8,796,673 B2
(45) Date of Patent: Aug. 5, 2014

(54) SEMICONDUCTING POLYMER

(75) Inventors: Yousef Haik, Al Ain (AE); Ahmad Ibrahim Ayesh, Al Ain (AE); Mahmood Allawy Mohsin, Al Ain (AE)

(73) Assignee: United Arab Emirates University, Al Ain (AE)

( * ) Notice: Subject to any disclaimer, the term of this patent is extended or adjusted under 35 U.S.C. 154(b) by 0 days.

(21) Appl. No.: 13/399,460

(22) Filed: Feb. 17, 2012

(65) Prior Publication Data

US 2012/0211732 A1  Aug. 23, 2012

Related U.S. Application Data

(60) Provisional application No. 61/444,704, filed on Feb. 19, 2011.

(51) Int. Cl.
| H01L 29/08 | (2006.01) |
| H01L 47/00 | (2006.01) |
| H01L 29/201 | (2006.01) |
| H01L 21/00 | (2006.01) |

(52) U.S. Cl.
CPC .............. *H01L 29/08* (2013.01); *H01L 47/00* (2013.01); *H01L 29/201* (2013.01); *H01L 21/00* (2013.01)
USPC ...................... 257/40; 257/4; 257/90; 438/40

(58) Field of Classification Search
CPC . H01L 51/0048; H01L 51/30; H01L 51/0591; H01L 51/0005; B82Y 10/00
USPC ..................................... 257/40, 4, 90; 438/40
See application file for complete search history.

(56) References Cited

U.S. PATENT DOCUMENTS

| 5,976,284 A * | 11/1999 | Calvert et al. ............... 156/51 |
| 2004/0002176 A1 * | 1/2004 | Xu ................................. 438/40 |
| 2004/0246770 A1 * | 12/2004 | Kano ............................ 365/154 |
| 2005/0249975 A1 * | 11/2005 | Sandberg et al. ............ 428/690 |
| 2005/0270442 A1 * | 12/2005 | Yang et al. ...................... 349/86 |
| 2006/0226396 A1 * | 10/2006 | Majumdar et al. ........... 252/500 |
| 2007/0176189 A1 * | 8/2007 | Joo et al. ......................... 257/90 |
| 2008/0191200 A1 | 8/2008 | Frisbie et al. |
| 2008/0192407 A1 | 8/2008 | Lu et al. |
| 2008/0304208 A1 * | 12/2008 | Murakami et al. ........... 361/505 |
| 2009/0040587 A1 | 2/2009 | Kugler |
| 2011/0079775 A1 * | 4/2011 | Zhu ................................ 257/40 |
| 2011/0272661 A1 * | 11/2011 | Yang et al. ....................... 257/4 |

OTHER PUBLICATIONS

Patent Cooperation Treaty, "International Search Report", U.S. Patent and Trademark Office, by L Young, Authorized Officer, in PCT Application No. PCT/US2012/025654, Document of 1 page, Jul. 27, 2012.

* cited by examiner

*Primary Examiner* — Long K Tran
*Assistant Examiner* — Dzung Tran
(74) *Attorney, Agent, or Firm* — Akerman LLP; Michael K. Dixon

(57) ABSTRACT

A semiconducting polymer formed from an insulator polymer and an ionic liquid is disclosed. In at least one embodiment, the semiconducting polymer may be formed from a homogenous blend of two or more insulator polymers and two or more ionic liquids. The homogenous mixture of nonconducting polymers and ionic liquid may be formed as a film of semiconducting polymer with a controllable thickness. The semiconducting polymer may be used in a multitude of different applications, including, but not limited to, storage devices.

17 Claims, 3 Drawing Sheets

SEMICONDUCTING POLYMER

CROSS-REFERENCE TO RELATED APPLICATION

This application claims priority to U.S. Provisional Patent Application No. 61/444,704, filed Feb. 19, 2011, the entirety of which is incorporated herein,

FIELD OF THE INVENTION

This invention is directed generally to conducting organic materials, and more particularly to semiconducting organic materials.

BACKGROUND

Semiconductors have long been formed from silicon. Silicon based semiconductors are limited by complex manufacturing processes needed to create the semiconductors, lack of flexibility and high cost. Thus, a need exists for an improved semiconductor.

SUMMARY OF THE INVENTION

A semiconducting material formed from one or more insulator polymers and one or more ionic liquids is disclosed. The semiconducting material may be synthesized by doping one or more of the insulator polymers with one or more ionic liquids. The semiconducting material may be used in a number of different applications, including, but not limited to, sensors and storage devices.

The semiconducting material may be formed from one or more insulator polymers and one or more ionic liquids. The ionic liquid may include one or more cationic and one or more anionic portions. The ionic liquid may be, but is not limited to, one or more of 1,3-Dialkylimidazolium Tetrafluoroborates, 1,3-Dialkylimidazolium Bromides, 1,3-Diakylimidazolium Bistrifluoromethanesulfonimide, 1-Alkyl-3-Aralkyl-Imidazolium and those ionic liquids derived from natural and renewable sources such as but not limited to, glycerol, xylitol, sorbitol and choline chloride. The insulator polymer may be, but is not limited to, one or more of polyvinyl alcohol, poly acrylic acid, poly ethylene glycol, ethyl cellulose, polyolefins, polyesters, nonpeptide polyamines, polyamides, polycarbonates, polyalkenes, polyvinyl ethers, polyglycolides, cellulose ethers, polyvinyl halides, polyhydroxyalkanoates, polyanhydrides, polystyrenes, polyacrylates, polymethacrylates, polyurethanes, ethylcelluloses, polystyrenes, poly(ε-caprolactone), poly(d,l-lactic acid) and poly(d,l-lactic acid-co-glycolic acid) and copolymers and blends thereof. The semiconducting material may be a homogenous blend of the insulator polymer and the ionic liquid. In at least one embodiment, the insulator polymer may be formed from two or more insulator polymers. Similarly, the ionic liquid may be formed from two or more ionic liquids. In another embodiment, the insulator polymer and ionic liquid may form a film. The film may have a predetermined thickness. The semiconductor material may be formed from the insulator polymer and the ionic liquid extruded under controlled temperature with a controllable thickness. In another embodiment, the semiconductor material formed from the insulator polymer and the ionic liquid may be formed into one or more fibers. The semiconducting material may be formed from up to 10 percent ionic liquid by weight with the remainder polymer and, more particularly, may be between zero percent and five percent ionic liquid by weight with the remainder polymer.

The semiconducting material may be used, in one example, to form one or more storage devices. The storage devices may be configured to store data and may be formed from one or more conductive layers positioned between a first insulator layer on a first side and a second insulator layer on a second side that is on a generally opposite side from the first side and a semiconducting film layer coupled to an outer surface of the first insulator. The conductive layer may be, but is not limited to being, a carbon nanotube (CNT), zinc oxide, or gold. The semiconducting film layer may at least partially formed from a polyvinyl acetate. The first insulator layer may be formed from an organic material. In particular, the first insulator layer may be formed from an organic poly-methyl-methacrylate material. The second insulator layer may be formed from an organic material. In particular, the second insulator layer may be formed from an organic poly-methyl-methacrylate material. A first electrode may be coupled to an outer surface of the semiconducting film layer and a second electrode may be coupled to an outer surface of the second insulator layer. The first and second electrodes may be formed from any conducting material such as, but not limited to, aluminum.

An advantage of this invention is that use of the semiconducting material eliminates the need for using the restrictive silicon semiconductor to more of an organic semiconductor that enables the creation of affordable, flexible and expandable organic devices.

These and other embodiments are described in more detail below.

BRIEF DESCRIPTION OF THE DRAWINGS

The accompanying drawings, which are incorporated in and form a part of the specification, illustrate embodiments of the presently disclosed invention and, together with the description, disclose the principles of the invention.

DETAILED DESCRIPTION OF THE INVENTION

Figure 1:
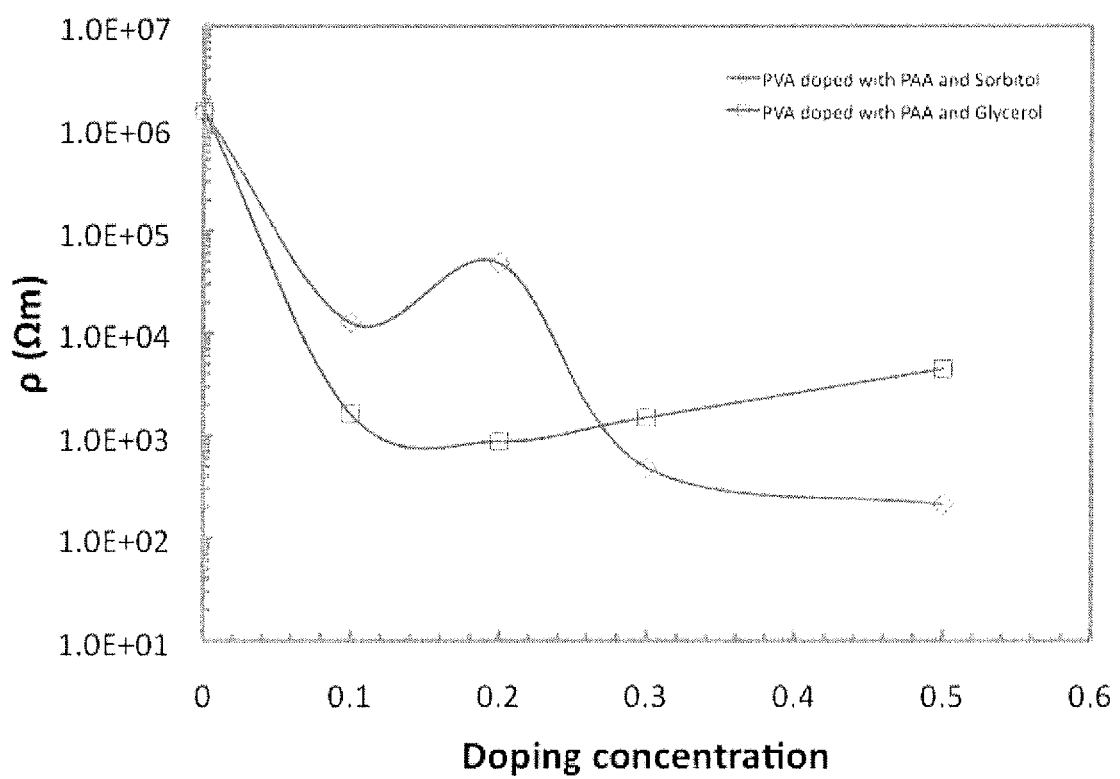
FIG. 1 is a graph of examples of two different insulator polymers of this invention that are doped with two ionic liquids, glycerol and sorbitol and that display regulated levels of resistivity based on the mixing between the insulators and the ionic liquid.
Figure 2:
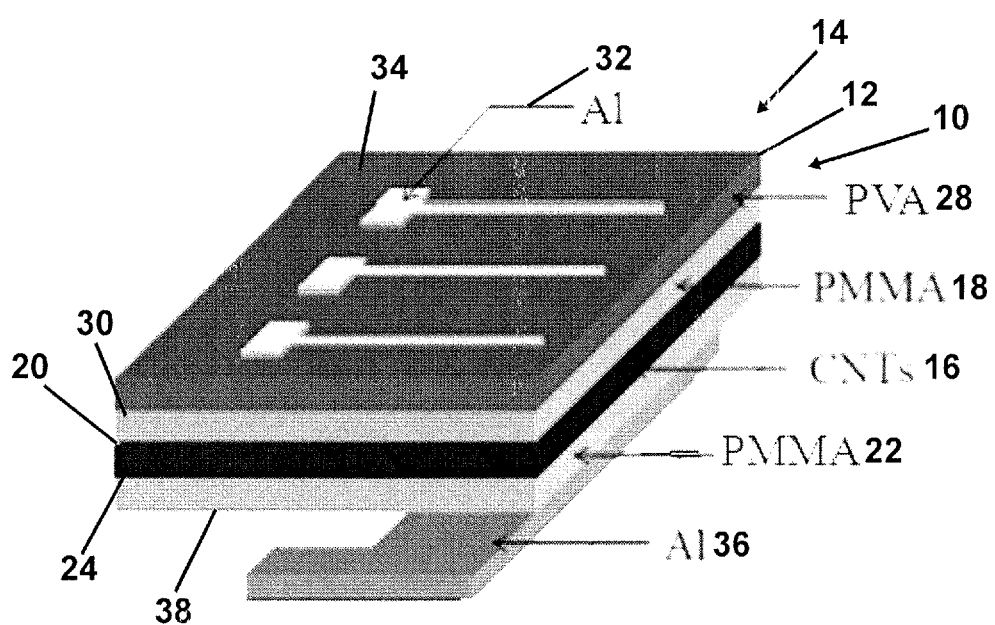
FIG. 2 is a perspective view of a schematic diagram of a storage device formed from the semiconducting material.
Figure 3:
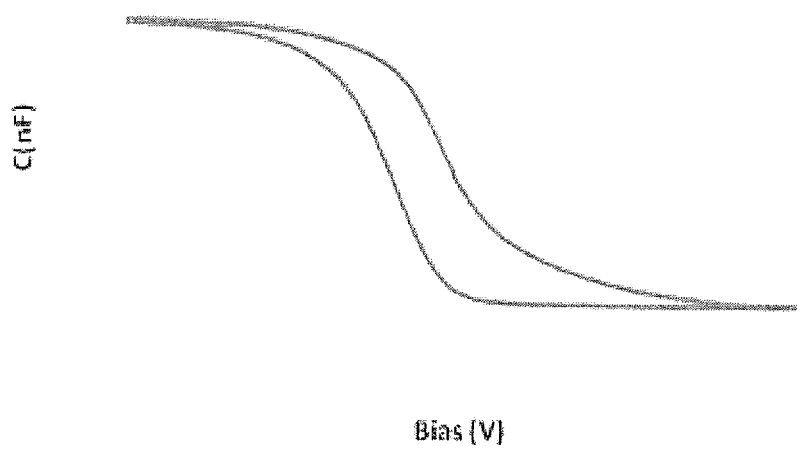
FIG. 3 is a hysteresis curve from the storage device.

As shown in FIGS. 1-3, a semiconducting material 10 formed from one or more insulator polymers and one or more ionic liquids is disclosed. The semiconducting material 10 may be synthesized by doping one or more of the insulator polymers with one or more ionic liquids. The semiconducting material 10 may be used in a number of different applications, including, but not limited to, sensors and storage devices.

In at least one embodiment, the ionic liquid may be, but is not limited to, one or more The ionic liquid may include one or more cationic and one or more anionic portions. The ionic liquid may be, but is not limited to being, one or more of ionic materials with a core structure of

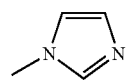

and 1,3-Diakylimidazolium Tetrafluoroborates, 1,3-Dialkylimidazolium Bromides, 1,3-Diakylimidazolium Bistrifluoromethanesulfonimide, 1-Alkyl-3-Aralkyl-Imidazolium, those ionic liquids derived from natural and renewable sources such as but not limited to, glycerol, xylitol, sorbitol, choline chloride and materials having core structures of

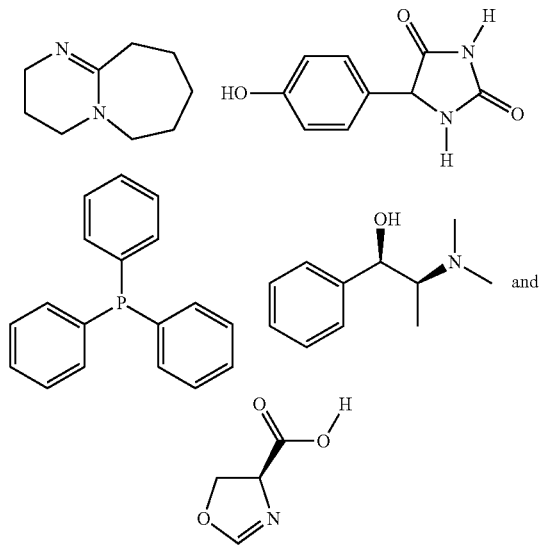

In another embodiment, the ionic liquid may be formed during the transesterification of algae oil. The insulator polymer may be, but is not limited to, one or more of polyvinyl alcohol, poly acrylic acid, poly ethylene glycol, ethyl cellulose, polyolefins, polyesters, nonpeptide polyamines, polyamides, polycarbonates, polyalkenes, polyvinyl ethers, polyglycolides, cellulose ethers, polyvinyl halides, polyhydroxyalkanoates, polyanhydrides, polystyrenes, polyacrylates, polymethacrylates, polyurethanes, ethylcelluloses, polystyrenes, poly(ε-caprolactone), poly(d,l-lactic acid) and poly(d,l-lactic acid-co-glycolic acid) and copolymers and blends thereof. In one embodiment, the semiconducting material may be a homogenous blend of the insulator polymer and the ionic liquid. In one embodiment, the insulator polymer may be formed from two or more insulator polymers. Similarly, the ionic liquid may be formed from two or more ionic liquids.

The combined insulator polymer and the ionic liquid may form a film 12. The film 12 may have a predetermined thickness. The semiconductor material 10 may be formed from one or more insulator polymers and one or more ionic liquids extruded under controlled temperature with a controllable thickness. The semiconductor material 10 may form one or more fibers from one or more insulator polymers and one or ionic liquid forms. The semiconductor material 10 may be synthesized by doping one or more of the insulator polymers with one or more ionic liquids, the function of which is displayed in FIGS. 1 and 3.

The semiconducting material 10 may be formed from up to 10 percent ionic liquid by weight with the remainder polymer and, more particularly, may be between zero percent and five percent ionic liquid by weight with the remainder polymer. The ionic liquid is added to the insulator polymer by dissolving the insulator polymer in water or an organic solvent and adding one or more ionic liquids to the mixture. The mixture may be stirred for between 1-30 minutes. In another embodiment, one or more ionic liquids may be mixed with one or more melted insulator polymers. The ionic liquid may be added to the polymer melt and then may be cast the melt to films. The percentage of added ionic liquid to insulator depends on the level of conductivity needs to be acquired in the semiconductor. For example, a mixture of PVA/PAA and 0.1 glycerol provides a high conductivity.

The semiconducting material 10 may be used, in at least one example, as shown in FIG. 2, to form a storage device 14 capable of storing data. The storage device 14 may be formed from a conductive layer 16 positioned between a first insulator layer 18 on a first side 20 and a second insulator layer 22 on a second side 24 that is on a generally opposite side from the first side 20. The conductive layer 16 may be, but is not limited to being, a carbon nanotube (CNT), zinc oxide, or gold. The storage device 14 may also include a semiconducting film layer 28 coupled to an outer surface 30 of the first insulator 18. The semiconducting film layer 28 may be flexible and may be at least partially formed from a polyvinyl acetate (PVA). The semiconducting film layer 28 may be deposited on the device to serve as the semiconducting layer. The first insulator layer 18 may be formed from an organic material. In at least one embodiment, the first insulator layer 18 may be formed from an organic poly-methyl-methacrylate material. The second insulator layer 22 may be formed from an organic material. In at least one embodiment, the second insulator layer 22 may be formed from an organic poly-methyl-methacrylate material.

The storage device 14 may include a first electrode 32 coupled to an outer surface 34 of the semiconducting film layer 28 and a second electrode 36 coupled to an outer surface 38 of the second insulator layer 22. The first and second electrodes 32, 36 are formed from any conductive material, such as, but not limited to, aluminum. As such, the storage device 14 may be formed from a first electrode 32, a first insulator layer 18, a conductive layer 16, a second insulator layer 22, a semiconducting film layer 28, and a second electrode 36.

The storage device 14 formed from the semiconducting material 10 may operate to read or write data, or both, with less than 2 volts, thereby enabling the devices 14 to be fully compatible with logic operation voltages.

The foregoing is provided for purposes of illustrating, explaining, and describing embodiments of this invention. Modifications and adaptations to these embodiments will be apparent to those skilled in the art and may be made without departing from the scope or spirit of this invention.

We claim:

1. A semiconducting material, comprising:
   at least two insulator polymers; and
   at least one ionic liquid;
   wherein the semiconducting material is a homogenous blend of the at least two insulator polymers and the at least one ionic liquid.

2. The semiconductor material of claim 1, wherein the at least one ionic liquid is selected from the group consisting of 1,3-Dialkylimidazolium Tetrafluoroborates, 1,3-Dialkylimidazolium Bromides, 1,3-Diakylimidazolium Bistrifluoromethanesulfonimide, 1-Alkyl-3-Aralkyl-Imidazolium, glycerol, xylitol, sorbitol, choline chloride and glycerol formed during the transesterification of algae oil.

3. The semiconductor material of claim 1, wherein the at least two insulator polymers are selected from the group consisting of poly acrylic acid, poly ethylene glycol, ethyl cellulose, polyolefins, polyesters, nonpeptide polyamines, polyamides, polycarbonates, polyalkenes, polyvinyl ethers, polyglycolides, cellulose ethers, polyvinyl halides, polyhydroxyalkanoates, polyanhydrides, polystyrenes, polyacrylates, polymethacrylates, polyurethanes, ethylcelluloses, polystyrenes, poly(ε-caprolactone), poly(d,l-lactic acid) and poly(d,l-lactic acid-co-glycolic acid) and copolymers.

4. The semiconductor material of claim 1, wherein at least one ionic liquid comprises at least two ionic liquids.

5. The semiconductor material of claim 1, wherein the at least two insulator polymers and at least one ionic liquid form a film.

6. The semiconductor material of claim 1, wherein the semiconductor material formed of the at least two insulator polymers and the at least one ionic liquid is extruded under controlled temperature with a controllable thickness.

7. The semiconductor material of claim 1, wherein the semiconductor material formed of the at least two insulator polymers and the at least one ionic liquid forms at least one fiber.

8. The semiconducting material of claim 1, wherein the at least one ionic liquid comprises up to 10 percent ionic liquid by weight.

9. The semiconducting material of claim 1, wherein the at least one ionic liquid comprises up to five percent ionic liquid by weight.

10. A storage device, comprising:
    at least one device formed from a conductive layer positioned between a first insulator layer on a first side and a second insulator layer on a second side that is on a generally opposite side from the first side; and
    a semiconducting film layer coupled to an outer surface of the first insulator;
    wherein the semiconducting material is a homogenous blend of the at least two insulator polymers and the at least one ionic liquid.

11. The storage device of claim 10, wherein the semiconducting film layer is at least partially formed from a polyvinyl acetate.

12. The storage device of claim 10, wherein the first insulator layer is formed from an organic material.

13. The storage device of claim 12, wherein the first insulator layer is formed from an organic poly-methyl-methacrylate material.

14. The storage device of claim 10, wherein the second insulator layer is formed from an organic material.

15. The storage device of claim 14, wherein the second insulator layer is formed from an organic poly-methyl-methacrylate material.

16. The storage device of claim 10, further comprising a first electrode coupled to an outer surface of the semiconducting film layer and a second electrode coupled to an outer surface of the second insulator layer.

17. The storage device of claim 16, wherein the first and second electrodes are formed from aluminum.

* * * * *